(12) United States Patent
Katsuma

(10) Patent No.: US 11,998,991 B2
(45) Date of Patent: Jun. 4, 2024

(54) COATED TOOL AND CUTTING TOOL

(71) Applicant: KYOCERA CORPORATION, Kyoto (JP)

(72) Inventor: Tadashi Katsuma, Satsumasendai (JP)

(73) Assignee: KYOCERA CORPORATION, Kyoto (JP)

( * ) Notice: Subject to any disclaimer, the term of this patent is extended or adjusted under 35 U.S.C. 154(b) by 652 days.

(21) Appl. No.: 17/273,310

(22) PCT Filed: Sep. 3, 2019

(86) PCT No.: PCT/JP2019/034598
§ 371 (c)(1),
(2) Date: Mar. 4, 2021

(87) PCT Pub. No.: WO2020/050262
PCT Pub. Date: Mar. 12, 2020

(65) Prior Publication Data
US 2021/0245260 A1    Aug. 12, 2021

(30) Foreign Application Priority Data
Sep. 5, 2018  (JP) .................................. 2018-166094

(51) Int. Cl.
*B23B 27/14*     (2006.01)
*C23C 16/36*     (2006.01)
(Continued)

(52) U.S. Cl.
CPC .............. *B23B 27/14* (2013.01); *C23C 16/36* (2013.01); *C23C 16/403* (2013.01);
(Continued)

(58) Field of Classification Search
None
See application file for complete search history.

(56) References Cited

U.S. PATENT DOCUMENTS

| | | |
|---|---|---|
| 5,915,162 A | 6/1999 | Uchino et al. |
| 6,344,265 B1 | 2/2002 | Blomstedt et al. |
| | (Continued) | |

FOREIGN PATENT DOCUMENTS

| | | |
|---|---|---|
| EP | 2703102 A1 | 3/2014 |
| JP | H07100701 A | 4/1995 |
| | (Continued) | |

*Primary Examiner* — Seth Dumbris
(74) *Attorney, Agent, or Firm* — VIERING, JENTSCHURA & PARTNER MBB

(57) ABSTRACT

A coated tool may include a base member including a first surface, and a coating layer. The coating layer may include a plurality of voids located side by side in a first layer in a direction along an interface, which is a boundary between the first layer and a second layer. The second layer may include a lower layer part and an upper layer part, and an angle formed by a normal line of (001) surface of the constituent particles with respect to a cross section of the second layer is an orientation difference, the lower layer part of the second layer includes a ratio of the particles whose orientation difference is 10° or more of 50% or more, and the upper layer part of the second layer includes a ratio of the particles whose orientation difference is 10° or less of 80% or more.

9 Claims, 7 Drawing Sheets

(51) Int. Cl.
*C23C 16/40* (2006.01)
*C23C 28/04* (2006.01)

(52) U.S. Cl.
CPC ........ *C23C 28/044* (2013.01); *B23B 2224/04* (2013.01); *B23B 2224/32* (2013.01)

(56) References Cited

U.S. PATENT DOCUMENTS

| | | | |
|---|---|---|---|
| 6,756,111 | B1 | 6/2004 | Okada et al. |
| 9,987,687 | B2 | 6/2018 | Lindahl et al. |
| 11,253,926 | B2 | 2/2022 | Katsuma |
| 2005/0123366 | A1 | 6/2005 | Goudemond et al. |
| 2006/0003187 | A1 | 1/2006 | Osada et al. |
| 2009/0044415 | A1 | 2/2009 | Fujino et al. |
| 2012/0202032 | A1 | 8/2012 | Tatsuoka et al. |
| 2014/0193624 | A1 | 7/2014 | Stiens et al. |
| 2014/0308083 | A1 | 10/2014 | Bjormander |
| 2015/0003925 | A1 | 1/2015 | Östlund et al. |
| 2016/0138153 | A1 | 5/2016 | Sobiech et al. |
| 2016/0175940 | A1 | 6/2016 | Lindahl et al. |
| 2017/0190591 | A1* | 7/2017 | Imamura .................. C01F 7/02 |
| 2017/0259344 | A1* | 9/2017 | Detani .................. B23B 27/148 |
| 2019/0039148 | A1 | 2/2019 | Kubo et al. |
| 2019/0232380 | A1 | 8/2019 | Kanaoka et al. |
| 2021/0187623 | A1 | 6/2021 | Katsuma |
| 2021/0187624 | A1 | 6/2021 | Katsuma |
| 2021/0197289 | A1 | 7/2021 | Katsuma |
| 2021/0220920 | A1 | 7/2021 | Katsuma |
| 2021/0339320 | A1 | 11/2021 | Katsuma |

FOREIGN PATENT DOCUMENTS

| | | |
|---|---|---|
| JP | H08300203 A | 11/1996 |
| JP | 2000071108 A | 3/2000 |
| JP | 2006015426 A | 1/2006 |
| JP | 2006116621 A | 5/2006 |
| JP | 2006231422 A | 9/2006 |
| JP | 2009107028 A | 5/2009 |
| JP | 2012187659 A | 10/2012 |
| JP | 2013126709 A | 6/2013 |
| JP | 2015009358 A | 1/2015 |
| JP | 2015182209 A | 10/2015 |
| JP | 2015188995 A | 11/2015 |
| JP | 6026468 B2 | 10/2016 |
| JP | 2017042901 A | 3/2017 |
| JP | 6238904 B2 | 11/2017 |
| JP | 2017221992 A | 12/2017 |
| JP | 2018103288 A | 7/2018 |
| WO | 0079022 A1 | 12/2000 |
| WO | 2006104004 A1 | 10/2006 |
| WO | 2012144088 A1 | 10/2012 |
| WO | 2017146200 A1 | 8/2017 |
| WO | 2017204141 A1 | 11/2017 |

* cited by examiner

COATED TOOL AND CUTTING TOOL

CROSS-REFERENCE TO RELATED APPLICATIONS

This application is a national stage entry according to 35 U.S.C. § 371 of PCT Application No. PCT/JP2019/034598 filed on Sep. 3, 2019, which claims priority to Japanese Application No. 2018-166094 filed on Sep. 5, 2018, which are entirely incorporated herein by reference.

The present disclosure relates to a coated tool for use in a cutting process.

BACKGROUND

As a coated tool for use in the cutting process, such as a turning process and a milling process, a coated tool is discussed in, for example, Patent Document 1 (Japanese Unexamined Patent Publication No. 2015-182209). The coated tool discussed in Patent Document 1 may include a configuration in which a coating layer is located on a surface of a base member composed of cemented carbide or the like. The coating layer may include a layer (titanium compound layer) including a compound of titanium (Ti), and a layer (aluminum oxide layer) including aluminum oxide ($Al_2O_3$). In the coated tool discussed in Patent Document 1, a plurality of voids may be formed at an interface between the titanium compound layer and the aluminum oxide layer. There is a discussion that impact relaxation effect may be obtainable because of the plurality of voids.

Further, in the coated tool described in Patent Document 2 (Japanese Unexamined Patent Publication No. 2017-042901), it is discussed that high wear resistance in an upper layer part and high adhesion in a lower layer part may be obtained by constituting an aluminum oxide layer with the upper layer part in which an area ratio of crystal grains in which normal line direction of (001) surface with respect to normal line direction of the surface of the aluminum oxide layer is within ±10° is 90%, and the lower layer part in which the area ratio of the crystal grains is 50% or less.

SUMMARY

A coated tool of the present disclosure may include a base member including a first surface, and a coating layer located at least on the first surface of the base member. The coating layer may include a first layer located on the first surface and including a titanium compound. The coating layer may include a second layer contactedly located on the first layer and including aluminum oxide. The coating layer may include a plurality of voids located side by side in the first layer in a direction along a boundary between the first layer and the second layer in a cross section orthogonal to the first surface. An average value of widths of the voids in a direction along the interface may be less than an average value of distances between the voids adjacent to each other. The second layer may include, in its thickness direction, a lower layer part located at a side of the base material and having a thickness of 0.1 to 2.0 µm, and an upper layer part located at a side of the surface which is opposite to the side of the base material and having a thickness of 1.0 to 5.0 µm. An angle formed by a normal line of (001) surface of the constituent particles with respect to a cross section of the second layer is an orientation difference, the lower layer part of the second layer may include a ratio of the particles whose orientation difference is 10° or more of 50% or more, and the upper layer part of the second layer may include a ratio of the particles whose orientation difference is 10° or less of 80% or more. A cutting tool of the present disclosure may include a holder including a bar shape which extends from a first end to a second end and including a pocket located at a side of the first end, and the above-mentioned coated tool which is located at the pocket.

DETAILED DESCRIPTION

Figure 1:
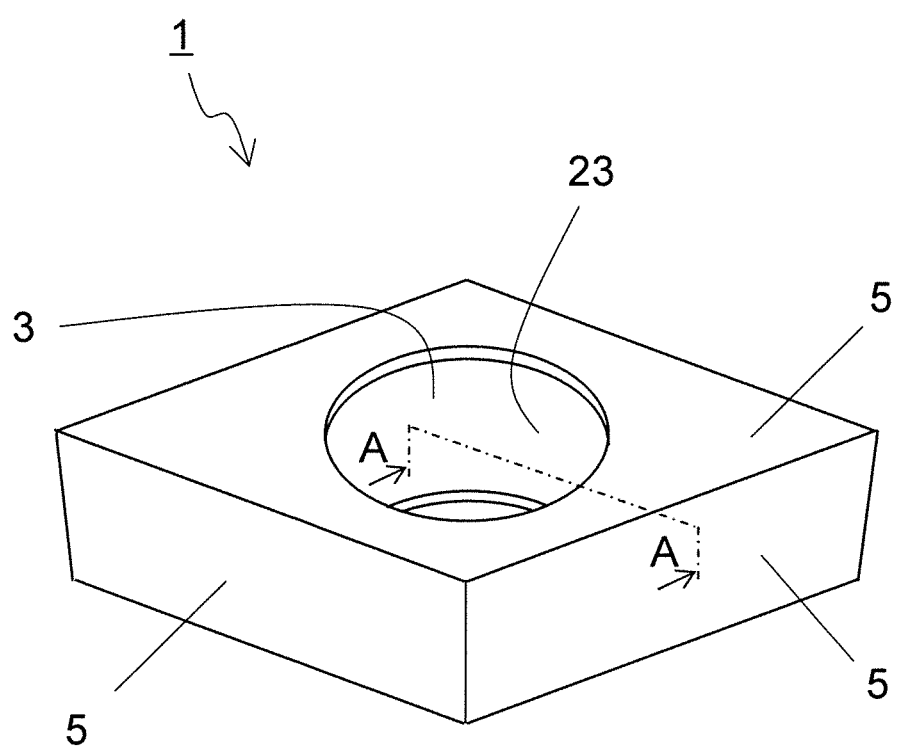
FIG. 1 is a perspective view illustrating a coated tool in a non-limiting embodiment.

A coated tool of the present disclosure is described in detail below with reference to the drawings. For the sake of description, each of the drawings referred to in the following illustrates, in a simplified form, only main members necessary for the explanation. Hence, the coated tool is capable of including any structural member not illustrated in the drawings referred to. Dimensions of the members in each of the drawings are not ones which faithfully represent dimensions of actual structural members and dimension ratios of these members.

<Coated Tool>

Figure 2:
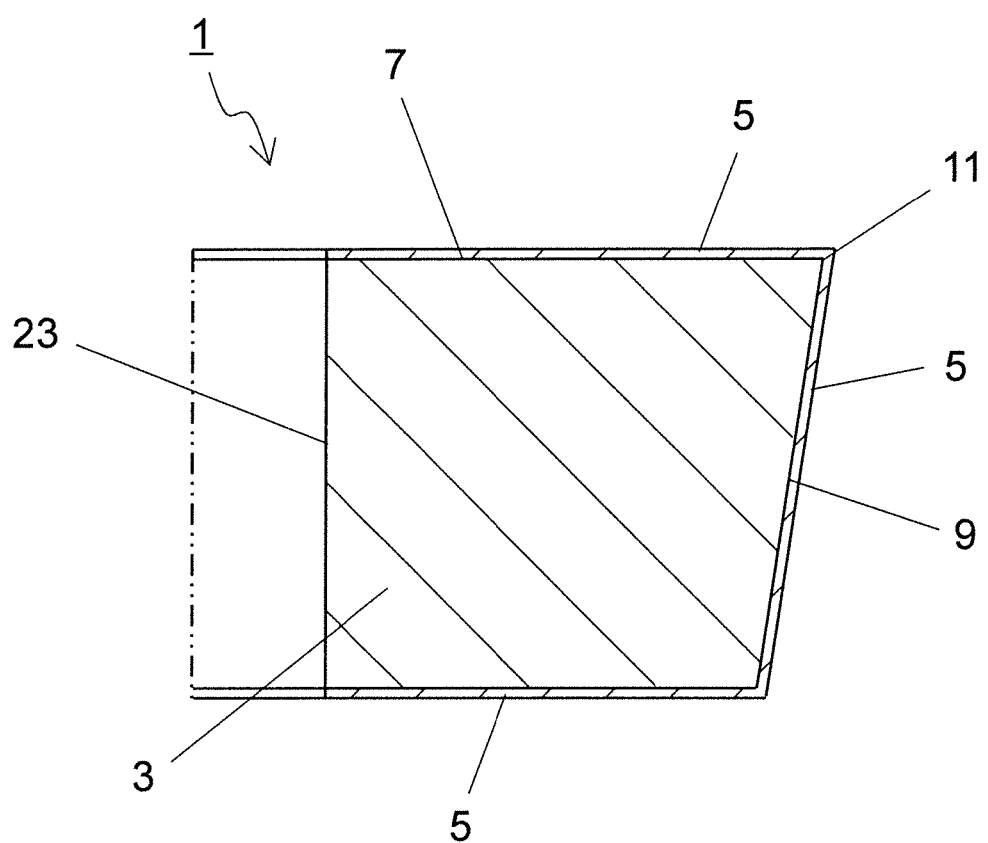
FIG. 2 is a sectional view taken along line A-A in the coated tool illustrated in FIG. 1.

A coated tool 1 of the present disclosure includes a base member 3 and a coating layer 5 as illustrated in FIGS. 1 and 2. The base member 3 of a non-limiting embodiment includes a first surface 7 (an upper surface in FIG. 2), a second surface 9 adjacent to the first surface 7 (a side surface in FIG. 2), and a cutting edge 11 located at least on a part of a ridge line where the first surface 7 intersects with the second surface 9.

The base member 3 of the present disclosure has a quadrangular plate shape, and the first surface 7 has a quadrangular shape. The number of the second surfaces 9 is therefore four. In a non-limiting embodiment, at least a part of the first surface 7 is a rake surface region, and at least a part of the second surface 9 is a flank surface region. The shape of the base member 3 is not limited to the quadrangular plate shape, and for example, the first surface 7 may have a triangular, pentagonal, hexagon or circular shape. Alternatively, the base member 3 may have a columnar shape besides the plate shape.

The coating layer 5 is located at least on the first surface 7 of the base member 3. The coating layer may be located only on the first surface 7 or on a surface other than the first surface 7 in the base member 3. The coating layer 5 is also located on the second surface 9 in addition to the first surface 7 in the example shown in FIG. 2. The coating layer 5 is included for the purpose of improving characteristics of the coated tool 1 during a cutting process, such as wear resistance and chipping resistance.

Figure 3:
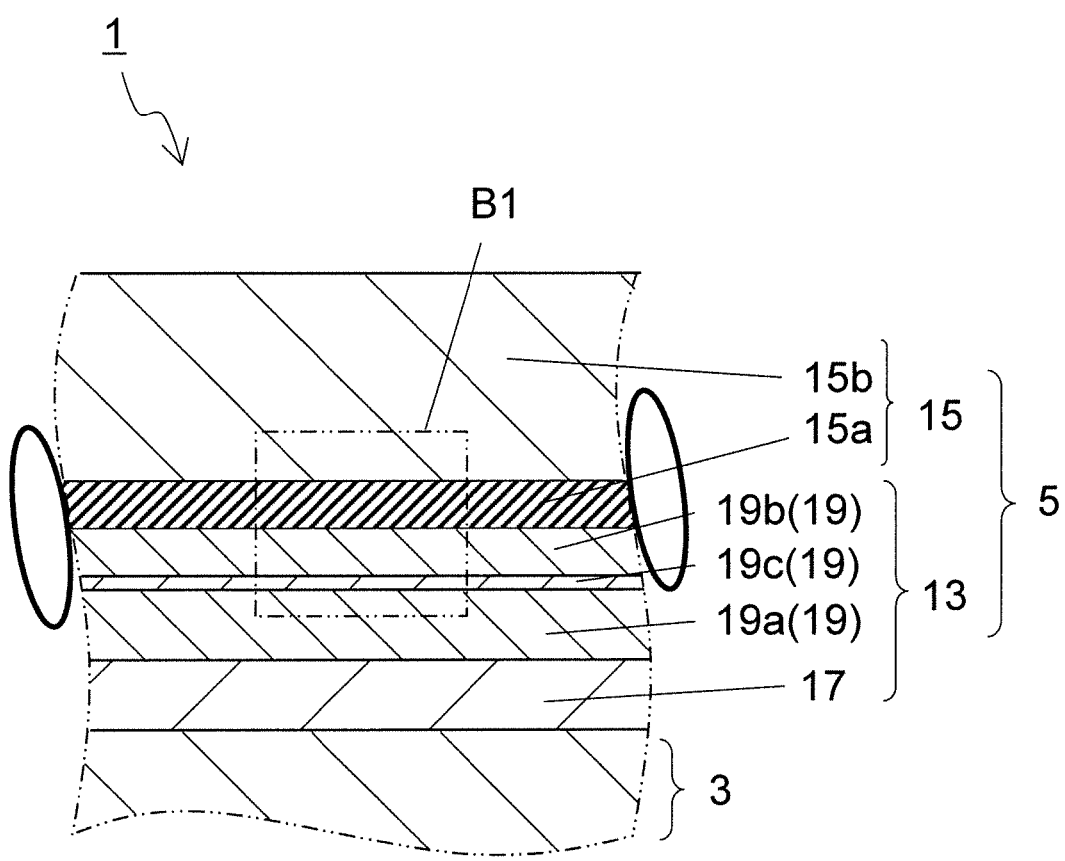
FIG. 3 is an enlarged view in the vicinity of a coating layer in the coated tool illustrated in FIG. 2.

The coating layer 5 of the present disclosure includes a first layer 13 and a second layer 15 as illustrated in FIG. 3.

The first layer 13 is located on the first surface 7 and includes a titanium compound. The second layer 15 is contactedly located on the first layer 13 and includes aluminum oxide ($Al_2O_3$).

Figure 4:
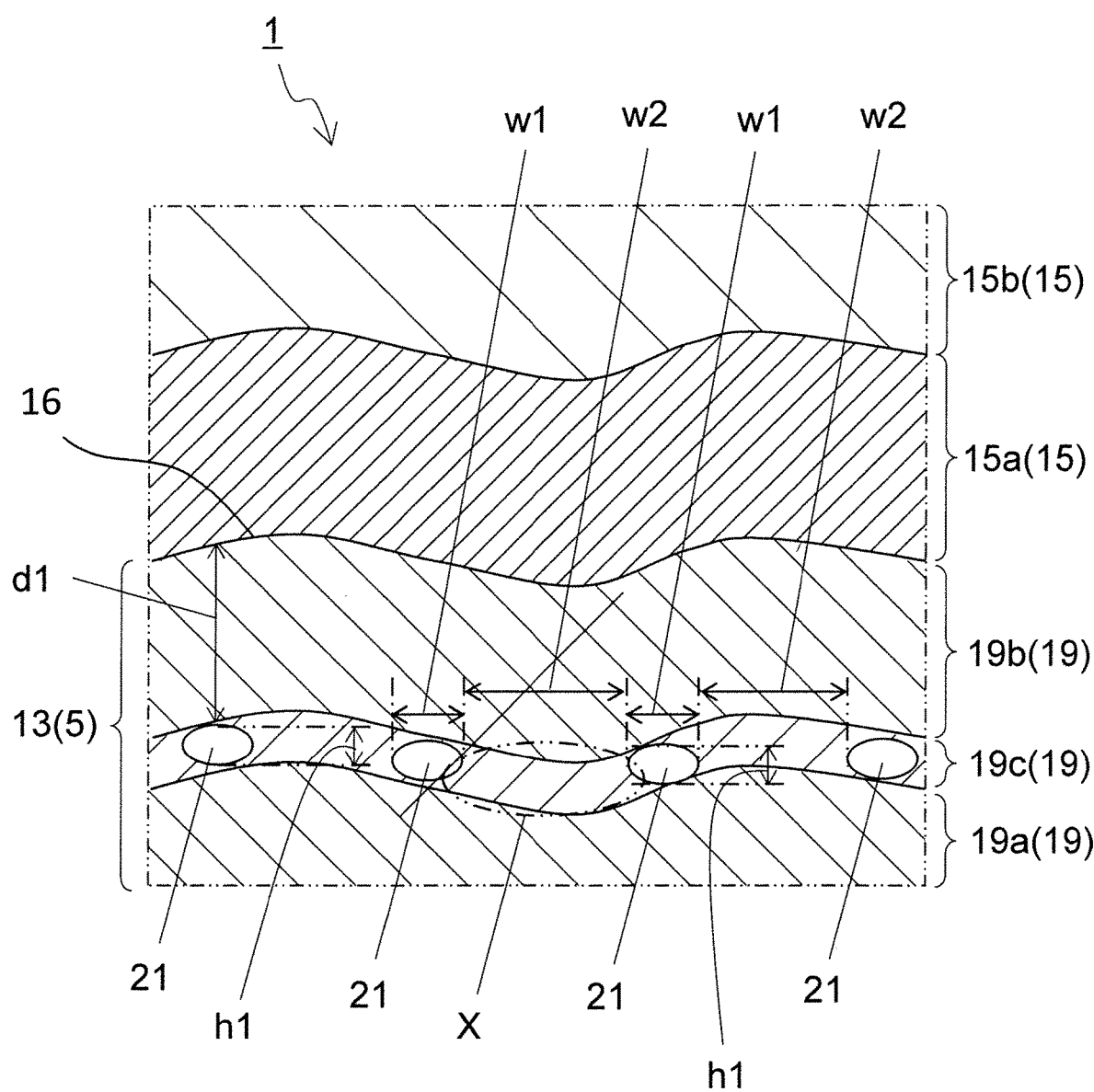
FIG. 4 is an enlarged view illustrating a non-limiting embodiment of the region B1 illustrated in FIG. 3.

The first layer 13 includes a plurality of voids 21 located side by side in a direction along a boundary between the first layer 13 and the second layer 15 in a cross section orthogonal to the first surface as illustrated in FIG. 4. An average value of widths w1 of the voids 21 in a direction along the interface is smaller than an average value of distances between the voids 21 adjacent to each other.

The second layer 15 includes, in its thickness direction, a lower layer part 15a located at a side of the base material 3 and having a thickness of 0.1 to 2.0 μm, and an upper layer part 15b located at a side of the surface which is opposite to the side of the base material 3 and having a thickness of 1.0 to 5.0 μm. An angle formed by a normal line of (001) surface of the constituent particles with respect to a cross section of the second layer 15 is an orientation difference, the lower layer part 15a includes a ratio of the particles whose orientation difference is 10° or more of 50% or more, and the upper layer part 15b includes a ratio of the particles whose orientation difference is 10° or less of 80% or more.

Examples of the titanium compound included in the first layer 13 include titanium carbide, nitride, oxide, carbonitride, carbon oxide and oxycarbonitride. The first layer 13 may be configured to include only one of the above compounds or, alternatively, may be configured to include a plurality of kinds of the above compounds.

The first layer 13 may be made into a single layer or, alternatively, may include a configuration in which a plurality of layers are laminated one on another as long as it includes a titanium compound. For example, the first layer 13 may include a configuration in which a titanium nitride layer 17 and a titanium carbonitride layer 19 are laminated one on another. Bondability between the base member 3 and the first layer 13 can be improved if the first layer 13 includes the titanium nitride layer 17. The titanium nitride layer 17 and the titanium carbonitride layer 19 include titanium nitride and titanium carbonitride as a main component, respectively, and may contain other components. The term "main component" denotes a component having the largest value in mass % among values of other components.

The coating layer 5 may be composed only of the first layer 13 and the second layer 15 or, alternatively, may include a layer other than these layers. For example, a different layer may be interposed between the base member 3 and the first layer 13 or, alternatively, a different layer may be located on the second layer 15.

The titanium carbonitride layer 19 may include a configuration in which a plurality of regions different in composition are laminated one on another. For example, the titanium carbonitride layer 19 may include a configuration in which a so-called MT (moderate temperature) first region 19a, and a so-called HT (high temperature) second region 19 are laminated one on another. A boundary between the layers and a boundary between the regions can be determined, for example, by observing an electron microscope photograph (a scanning electron microscope (SEM: Scanning Electron Microscope) photograph or a transmission electron microscope (TEM: Transmission Electron Microscope) photograph). Identification can be performed by the ratio of elements constituting each layer and differences in a size or an orientation of a crystal.

In cases where the first layer 13 includes the first region 19a and the second region 19b, the first layer 13 may further include an intermediate region 19c between the first region 19a and the second region 19b.

Examples of the aluminum oxide included in the second layer 15 include α-alumina (α-$Al_2O_3$), γ-alumina (γ-$Al_2O_3$) and κ-alumina (κ-$Al_2O_3$). If the second layer 15 includes α-alumina of these as a main component, heat resistance of the coated tool 1 can be enhanced. The second layer 15 may be configured to include only one of the above compounds or, alternatively, may include a plurality of kinds of the above compounds.

Identification of the aluminum oxide included in the second layer 15 from among the above compounds can be evaluated, for example, by carrying out X-ray diffraction (XRD) analysis and by observing a distribution of peak values.

A content ratio of the titanium compound in the first layer 13 and a content ratio of the aluminum oxide in the second layer 15 are not limited to a specific value. A non-limiting embodiment thereof is a configuration in which the first layer 13 includes the titanium compound as a main component, and the second layer 15 includes the aluminum oxide as a main component. The term "main component" denotes a component having the largest value in mass % among values of other components.

The first layer 13 may include a component other than the titanium compound, and the second layer 15 may include a component other than the aluminum oxide. For example, bondability between the first layer 13 and the second layer 15 is improved if the first layer 13 includes the aluminum oxide and the second layer 15 includes the titanium compound.

The coating layer 5 includes the voids 21 in an interior of the first layer 13 as illustrated in FIG. 4. Specifically, the coating layer 5 includes the plurality of voids 21 located side by side in the first layer 13 in a direction along a boundary 16 between the first layer 13 and the second layer 15 in a cross section orthogonal to the first surface 7 of the base member 3.

It is therefore possible to obtain the impact relaxation effect because of the voids 21 while reducing degradation of the bondability between the first layer 13 and the second layer 15. Consequently, the coated tool 1 has good bondability while keeping the enhanced impact resistance.

In evaluating the average value of the widths w1 of the voids 21 in the direction parallel to the first surface 7, it is unnecessary to evaluate the widths w1 of all the voids 21 existing in the cross section orthogonal to the first surface 7, but the average value may be evaluated by an average value of the widths w1 of approximately 10 voids 21 located side by side in the cross section. For example, a 10 μm square region including the boundary between the first layer 13 and the second layer 15 may be extracted in the cross section orthogonal to the first surface 7, and the widths w1 of the voids 21 in the region may be measured. An average value of the widths w2 of the first portion X may be evaluated by an average value of distances between approximately 5 voids 21 located side by side in the cross section.

Figure 5:
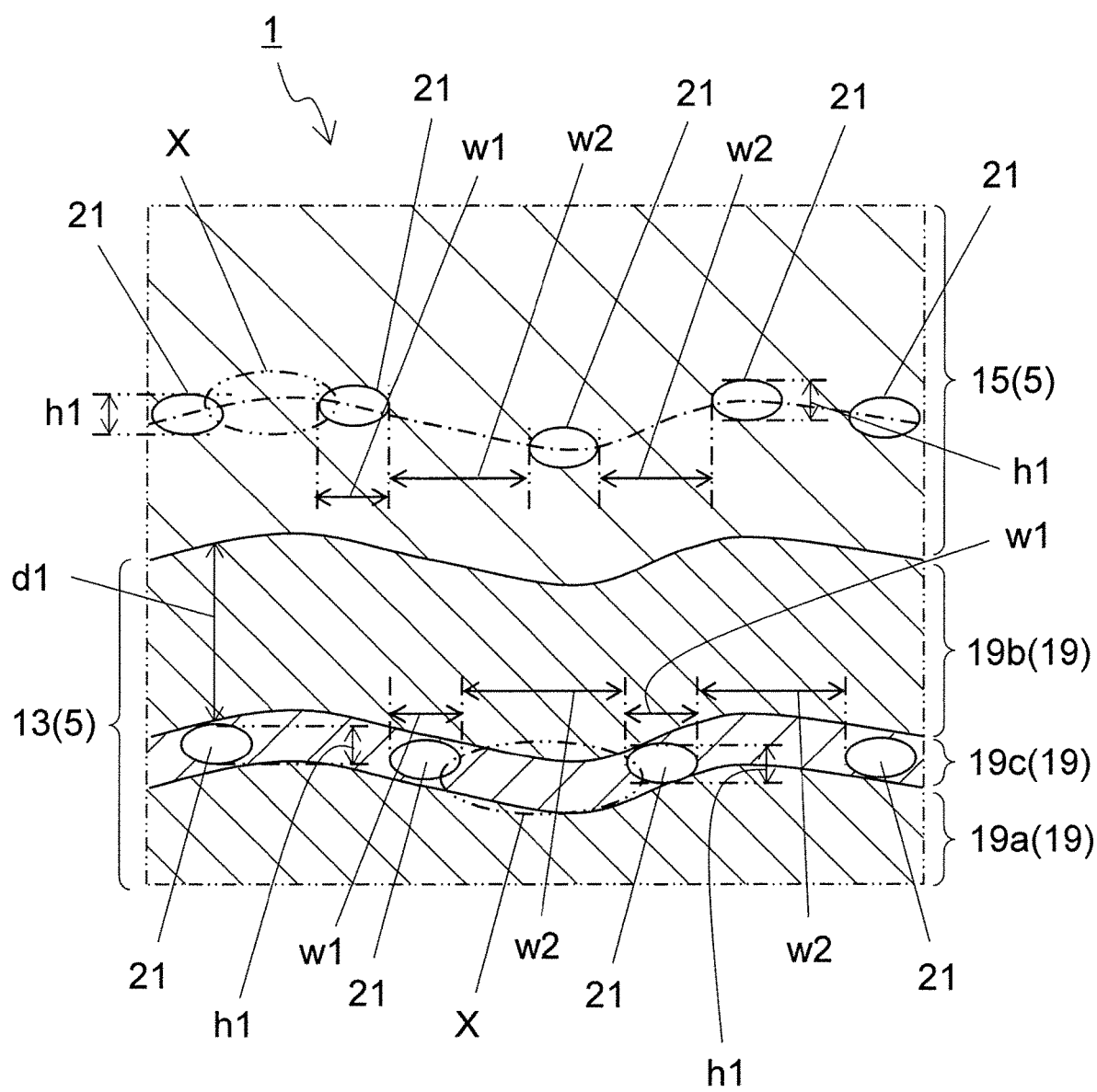
FIG. 5 is an enlarged view illustrating another non-limiting embodiment of the region B1 illustrated in FIG. 3.

The voids 21 may exist in the first layer 13. Besides the configuration in which the voids 21 are located in the first layer 13 as illustrated in FIG. 4, it is possible to employ, for example, a configuration in which the voids 21 are located in each of the first layer 13 and the second layer 15 as illustrated in FIG. 5. An imaginary line segment along the boundary between the first layer 13 and the second layer 15 is indicated by a chain line in FIG. 5, and the voids 21 located in the second layer 15 may be located along the boundary between the first layer 13 and the second layer 15. In FIG. 5, the lower layer part 15a and the upper layer part 15b are omitted.

The phrase that "the voids 21 are located along the boundary between the first layer 13 and the second layer 15" denotes that distances from the plurality of voids 21 to the boundary between the first layer 13 and the second layer 15 fall within a range of ±20% of an average value thereof.

In cases where the first layer 13 includes titanium carbonitride as a titanium compound and the second layer includes α-alumina as aluminum oxide from the viewpoint of heat resistance and durability of the coated tool 1, the durability of the coated tool 1 can be further enhanced if the plurality of voids 21 are located in the first layer 13.

The reason for this is as follows. Hardness of the titanium carbonitride is higher but impact resistance thereof is lower than that of α-alumina. Therefore, if the voids 21 are located in the first layer 13, impact resistance because of the voids 21 can be enhanced in the first layer 13, and the durability of the coated tool 1 can be further enhanced.

Although no particular limitations are imposed on size of the voids 21, the size is settable to, for example, 20-200 nm. The impact relaxation effect because of the voids 21 can be enhanced if the size of the voids 21 is 20 nm or more. It is easy to maintain the strength of the first layer 13 if the size of the voids 21 is 200 nm or less. The term "size of the voids 21" denotes a maximum value of the widths w1 of the voids 21 in the cross section orthogonal to the first surface 7.

No particular limitations are imposed on shape of the voids 21. The impact resistance can be further enhanced while reducing a ratio of the voids 21 if the width w1 in the direction parallel to the first surface 7 is larger than a height h1 in the direction orthogonal to the first surface 7, in other words, if the average value of the widths w1 of the voids 21 in the direction parallel to the first surface 7 is larger than an average value of the heights h1 of the voids 21 in the direction orthogonal to the first surface 7 in the cross section orthogonal to the first surface 7. The reason for this is as follows.

During a cutting process of a workpiece for the purpose of manufacturing a cut product, the coating layer is susceptible to a cutting load in the direction orthogonal to the first surface 7. If the voids 21 have such a shape that the width w1 in the direction parallel to the first surface 7 is larger than the height h1 in the direction orthogonal to the first surface 7, the cutting load can be absorbed in a wide range of the voids 21 without making the voids 21 larger than necessary. This makes it possible to further enhance the impact resistance while reducing the ratio of the voids 21.

Specifically, the cutting load tends to be absorbed in a wide range of the voids 21 if a ratio of the average value of the widths w1 of the voids 21 in the direction orthogonal to the first surface 7 to the average value of the heights h1 of the voids 21 in the direction parallel to the first surface 7 is 1.2 or more. Additionally, if the above ratio is 2 or less, it is easy to ensure a deformation amount of the voids 21 in the direction orthogonal to the first surface 7, thus leading to stable absorption of the cutting load in the voids 21.

If the average value of the heights h1 of the voids 21 in the direction orthogonal to the first surface 7 is smaller than Rz where Rz is a maximum height of the boundary between the first surface 7 and the second surface 9 in the cross section orthogonal to the first surface 7, it is easy to reduce degradation of the durability of the coating layer 5.

The coated tool 1 of the present disclosure has the enhanced impact resistance because of deformation of the first portion X located between the voids 21 adjacent to each other and because of deformation of the plurality of voids 21 in the first layer 13. If an average value of widths of the voids 21 in the direction orthogonal to the first surface 7 is smaller than Rz, an imaginary line connecting the voids 21 adjacent to each other is indicated by a zigzag shape that is bent larger than the width of the void 21.

In cases where the imaginary line is indicated by the above shape, even if a crack occurs at one of the first portions X, the crack is less likely to propagate to the first portion X located adjacent to the first portion X with the crack. The durability of the coating layer 5 is therefore less likely to degrade.

The durability of the coating layer 5 is also less likely to degrade if an average value of distances dl from the voids 21 to the boundary between the first layer 13 and the second layer 15 is larger than an average value of widths w2 of the first portions X in the cross section orthogonal to the first surface 7.

The reason for this is as follows. Because, in comparison with the first portions X, the above case ensures a sufficient distance from the voids 21 to the boundary between the first layer 13 and the second layer 15, even if a crack occurs at one of the first portions X, the crack is less likely to reach the boundary between the first layer 13 and the second layer 15. The bondability between the first layer 13 and the second layer 15 is less likely to degrade because the crack is less likely to reach the boundary between the first layer 13 and the second layer 15.

The voids 21 are located in the first layer 13 and located away from the boundary between the first layer 13 and the second layer 15. The bondability between the first layer 13 and the second layer 15 is less likely to degrade while achieving enhanced impact resistance in the coating layer 5 if an average value of the distances dl from the voids 21 to the boundary between the first layer 13 and the second layer 15 is larger than an average value of the heights h1 of the voids 21 in the direction orthogonal to the first surface 7 in the cross section orthogonal to the first surface 7.

The reason for this is as follows. Because, in comparison with the size of the voids 21, the distance from the voids 21 to the boundary between the first layer 13 and the second layer 15 can be sufficiently ensured, even if the voids 21 are deformed due to absorption of the cutting load, the boundary between the first layer 13 and the second layer 15 is not deformed, or the deformation amount becomes sufficiently small. The bondability between the first layer 13 and the second layer 15 is less likely to degrade because the boundary between the first layer 13 and the second layer 15 is less subjected to large deformation.

The crystal orientation of each of the crystal grains in the second layer 15 may be identified by an electron backscatter diffraction (EBSD) method, and in the obtained image, adjusting the coloring makes it possible to show the α-alumina crystal particles 15 in different colors according to the orientation, and to show the space between the crystal particles 15 adjacent to each other in black, for example.

By adjusting the coloring as described above, it is possible to easily determine boundaries between the plurality of α-alumina crystal particles included in the first layer 15. Since the color of the α-alumina crystal particles displayed according to the orientation is different, it is possible to easily evaluate whether each of the α-alumina crystal particles includes only one orientation or includes two or more regions including different orientations from one another.

The crystal particles existing in the second layer include α-alumina, and the α-alumina includes a crystal structure of hexagonal crystal lattice. That is, in the α-alumina crystal particles, the α-alumina crystal has a generally hexagonal column shape. The surface corresponding to the end surface of hexagon in the hexagonal column is a (001) surface in the α-alumina crystal. Therefore, the α-alumina crystal has a shape extending in a direction orthogonal to the (001) surface.

In the upper layer part 15b, the area occupied by the crystal grains in which normal line direction of the (001) surface with respect to normal line direction of the surface of the second layer 15 is within ±10° is 80% or more, and in the lower layer part 15a, the area occupied by the crystal grains in which normal line direction of the (001) surface with respect to normal line direction of the surface of the second layer 15 is ±10° or more is 50% or more. By having this configuration, high wear resistance in the second layer 15b located at the side of the surface and high bondability in the lower layer part 15a located at the side of the base member 3 with the first layer 19 can be exhibited. Therefore, the coated tool 1 of the present disclosure is also excellent in mechanical properties.

Examples of material of the base member 3 include inorganic materials, such as cemented carbide, cermet and ceramics. The material of the base member 3 is not limited to these materials.

Examples of composition of cemented carbide include WC(tungsten carbide)-Co, WC—TiC(titanium carbide)-Co and WC—TiC—TaC(tantalum carbide)-Co. Specifically, WC, TiC and TaC are hard particles, and Co is a binding phase. The cermet is a sintered composite material obtainable by compositing metal into a ceramic component. Specific examples of the cermet include compounds composed mainly of TiC, TiCN or TiN (titanium nitride).

The base member 3 may include a through hole 23 that passes through the first surface 7 and a surface located on an opposite side of the first surface 7. The through hole 23 is usable for inserting a fixing member that is intended to fix the coated tool 1 to a holder. Examples of the fixing member include a screw and a clamping member.

The size of the base member 3 is not particularly limited. For example, a length of one side of the first surface 7 is settable to approximately 3-20 mm in a non-limiting embodiment. A height from the first surface 7 to the surface located on the opposite side of the first surface 7 is settable to approximately 5-20 mm.

<Manufacturing Method>

A non-limiting embodiment of a method for manufacturing a coated tool as discussed above is described below.

Firstly, a mixed powder is manufactured by suitably adding metal powder, carbon powder or the like to inorganic powder selected from carbide, nitride, carbonitride and oxide or the like, which are capable of forming a hard alloy constituting a base member 3 by sintering, and then by mixing them together. Subsequently, a molded body is manufactured by molding the mixed powder into a predetermined tool shape with the use of a known molding method. Examples of the molding method include press molding, casting molding, extrusion molding and cold isostatic pressing. The base member 3 is manufactured by sintering the molded body in vacuum or a non-oxidizing atmosphere. A surface of the base member 3 may be then subjected to polishing process and honing process as needed.

Subsequently, a coating layer 5 is deposited on the surface of the base member 3 by chemical vapor deposition (CVD) method.

The first step is to deposit a titanium nitride layer 17 (underlayer) in the first layer 13. A first mixed gas used as a reaction gas is manufactured by mixing 0.5-10 vol % of titanium tetrachloride gas and 10-60 vol % of nitrogen gas into hydrogen ($H_2$) gas. The titanium nitride layer 17 is deposited in a temperature range of 830-870° C. by introducing the first mixed gas at a gas partial pressure of 10-20 kPa into a chamber.

The next step is to deposit a first region 19a in the first layer 13. A second mixed gas is manufactured by blending 0.5-10 vol % of titanium tetrachloride gas, 5-60 vol % of nitrogen gas and 0.1-3 vol % of acetonitrile gas into hydrogen gas. The MT-first region 19a is deposited in a temperature range of 830-870° C. by introducing the second mixed gas at a gas partial pressure of 6-12 kPa into the chamber.

The next step is to deposit an intermediate region 19c. A third mixed gas is manufactured by blending 3-30 vol % of titanium tetrachloride gas, 3-15 vol % of methane gas, 5-10 vol % of nitrogen gas and 0.5-5 vol % of carbon dioxide ($CO_2$) gas into hydrogen gas. The intermediate region 19c having a thickness of approximately 50-300 nm is deposited in a temperature range of 980-1050° C. by introducing the third mixed gas at a gas partial pressure of 6-12 kPa into the chamber. Voids 21 are formable in the intermediate region 19c because the third mixed gas includes carbon dioxide gas.

Additionally, since the thickness of the intermediate region 19c is as small as approximately 50-300 nm, it becomes possible to align the voids 21 formed in the intermediate region 19c in a direction along the boundary between the first layer 13 and the second layer 15.

The next step is to deposit a second region 19b in the first layer 13. A fourth mixed gas is manufactured by blending 1-4 vol % of titanium tetrachloride gas, 5-20 vol % of nitrogen gas, 0.1-10 vol % of methane gas and 0.5-vol % of carbon dioxide gas into hydrogen gas. The HT-second region 19b having a thickness of approximately 0.3-3 μm is deposited in a temperature range of 950-1050° C. by introducing the fourth mixed gas at a gas partial pressure of 5-45 kPa into the chamber.

The next step is to deposit a lower layer part 15a. A deposition temperature is set to 950-1100° C., and a gas pressure is set to 5-20 kPa. A reaction gas composition is as follows. A fifth mixed gas is manufactured by blending 5-15 vol % of aluminum trichloride ($AlCl_3$) gas, 0.5-2.5 vol % of hydrogen chloride (HCl) gas, 0.5-5.0 vol % of carbon dioxide gas and 1.5-5.0 vol % of hydrogen sulfide ($H_2S$) gas into hydrogen gas. The lower layer part 15a is deposited by introducing the fifth mixed gas into the chamber.

The next step is to deposit an upper layer part 15b. A deposition temperature is set to 950-1100° C., and a gas pressure is set to 5-20 kPa. A reaction gas composition is as follows. A sixth mixed gas is manufactured by blending 5-15 vol % of aluminum trichloride ($AlCl_3$) gas, 0.5-2.5 vol % of hydrogen chloride (HCl) gas, 0.5-5.0 vol % of carbon dioxide gas and 0-1.5 vol % of hydrogen sulfide ($H_2S$) gas into hydrogen gas. The upper layer part 15b is deposited by introducing the sixth mixed gas into the chamber.

Thereafter, as needed, a polishing process is carried out on a part of the surface of the deposited coating layer 5 at which the cutting edge 11 is located. If the polishing process is carried out, a workpiece is less likely to be welded onto the cutting edge 11, thus leading to the coated tool 1 having more excellent fracture resistance.

The above manufacturing method is a non-limiting embodiment of the method for manufacturing the coated tool 1 of the present disclosure. Hence, the coated tools 1 are not limited to ones which are manufactured by the above manufacturing method. For example, a third layer may be deposited separately on the second layer 15.

In order to manufacture the coated tool 1 in which the average value of the widths w1 of the voids 21 in the direction parallel to the first surface 7 is larger than an average value of the heights h1 of the voids 21 in the direction orthogonal to the first surface 7 in the cross section orthogonal to the first surface 7, time adjustment may be carried out during the deposition of the intermediate region 19c so as to be deposited in a thickness of approximately 50-150 nm.

In order to manufacture the coated tool 1 in which an average value of the distances dl from the voids 21 to the boundary 16 is larger than an average value of the heights h1 of the voids 21 in the direction orthogonal to the first surface 7 in the cross section orthogonal to the first surface 7, time adjustment may be carried out during the deposition of the intermediate region 19c so as to be deposited in a thickness of approximately 50-150 nm, and thereafter time adjustment may be carried out during the deposition of the second region 19b in the first layer 13 so as to be deposited in a thickness of approximately 0.5-3 μm. In order to manufacture the coated tool 1 in which the average value of the distances dl from the voids 21 to the boundary 16 is larger than an average value of the widths w2 of the voids 21 adjacent to each other in the cross section orthogonal to the first surface, time adjustment may be carried out during the deposition of the second region 19b in the first layer 13 so as to be deposited in a thickness of approximately 0.5-3 μm.

<Cutting Tool>

A cutting tool 101 of a non-limiting embodiment is described below with reference to the drawings.

Figure 6:
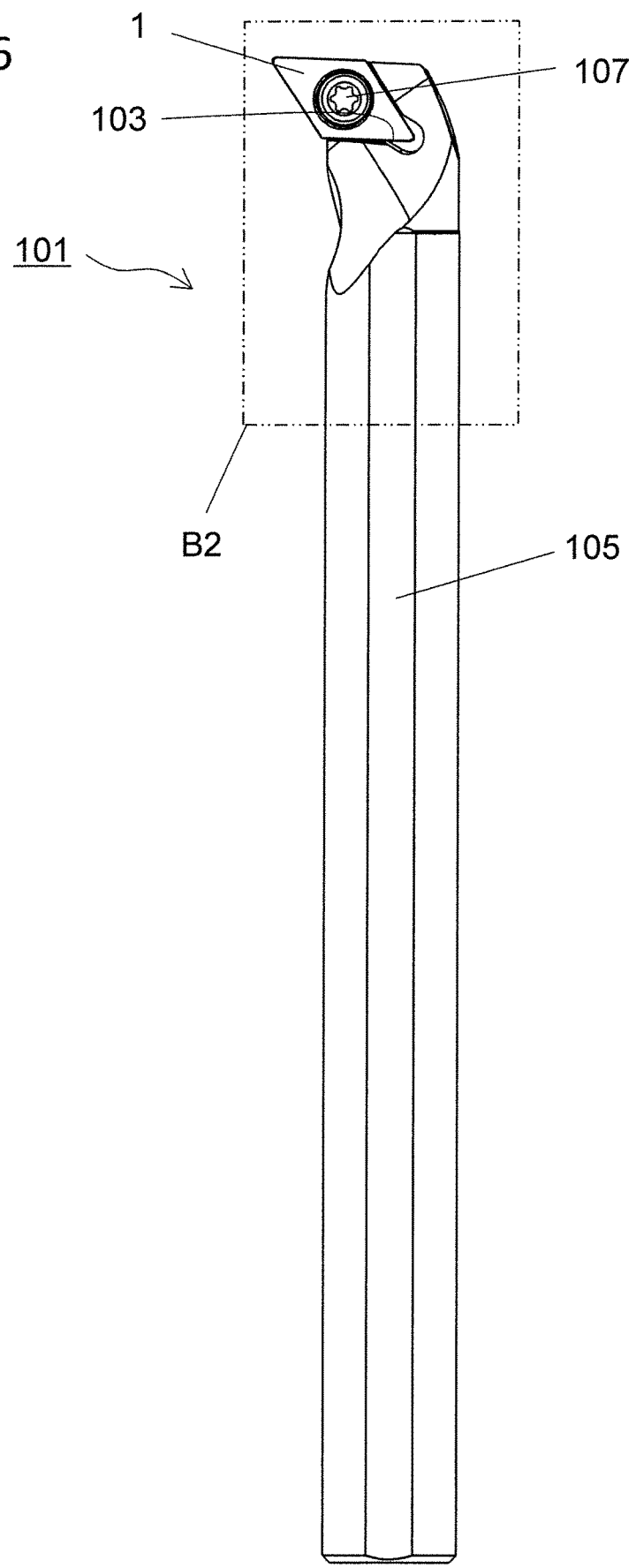
FIG. 6 is a plan view illustrating a cutting tool of the present disclosure.
Figure 7:
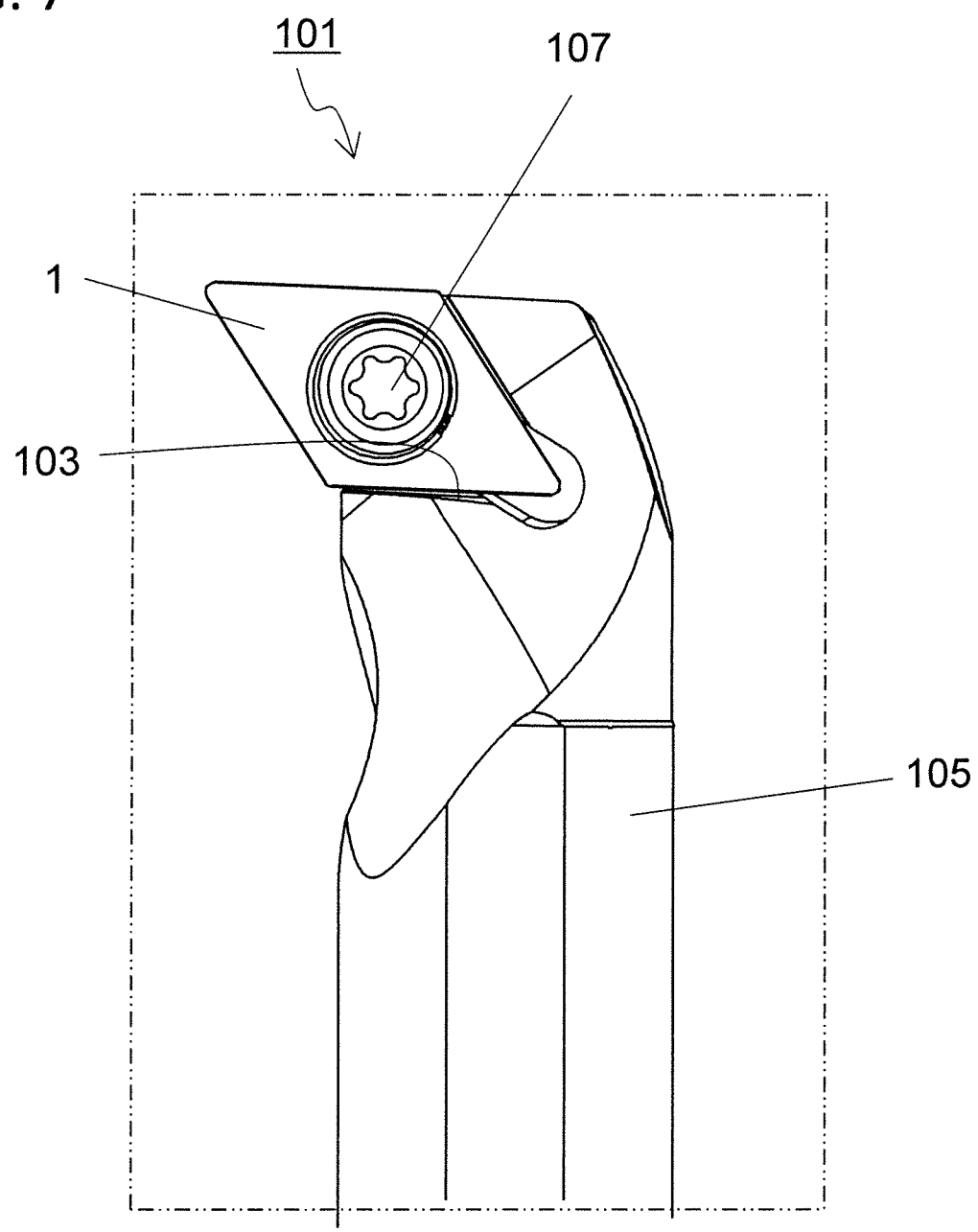
FIG. 7 is an enlarged view in a region B2 illustrated in FIG. 6.

As illustrated in FIGS. 6 and 7, the cutting tool 101 of a non-limiting embodiment includes a holder 105 including a bar-shaped body that extends from a first end (an upper side in FIGS. 6 and 7) to a second end (a lower side in FIGS. 6 and 7) with a pocket 103 located at a side of the first end, and the above-mentioned coated tool 1 located at the pocket 103. In the cutting tool 101, the coated tool 1 is attached so that a part of the ridge line which is usable as a cutting edge is protruded from a front end of the holder 105 in the examples shown in FIGS. 6 and 7.

The pocket 103 is a part that permits attachment of the coated tool 1. The pocket 103 includes a seating surface parallel to a lower surface of the holder 105, and a constraining side surface inclined relative to the seating surface. The pocket 103 opens into a side of the first end of the holder 105.

The coated tool 1 is located at the pocket 103. A lower surface of the coated tool 1 may be in a direct contact with the pocket 103. Alternatively, a sheet may be held between the coated tool 1 and the pocket 103.

The coated tool 1 is attached so that the part of the ridge line which is usable as the cutting edge is protruded outward from the holder 105. In a non-limiting embodiment, the coated tool 1 is attached to the holder 105 by a screw 107. Specifically, the coated tool 1 is attached to the holder 105 in such a manner that screw parts are engaged with each other by inserting the screw 107 into the through hole of the coated tool 1, and by inserting a front end of the screw 107 into a screw hole (not illustrated) formed in the pocket 103.

For example, steel and cast iron are usable as the holder 105. High toughness steel may be used in a non-limiting embodiment.

The present disclosure has illustrated and described the cutting tools for use in the so-called turning process. Examples of the turning process include inner diameter processing, outer diameter processing and grooving process. The cutting tools are not limited to ones which are used for the turning process. For example, the coated tools 1 of the present disclosure are applicable to the cutting tools for use in the milling process.

DESCRIPTION OF THE REFERENCE NUMERALS 1 coated tool
3 base member
5 coating layer
7 first surface
9 second surface
11 cutting edge
13 first layer
15 second layer
15a lower layer part
15b upper layer part
16 boundary between first layer and second layer
17 titanium nitride layer
19 titanium carbonitride layer
19a first region
19b second region
19c intermediate region
21 void
23 through hole
101 cutting tool
103 pocket
105 holder
107 fixing screw

What is claimed is:

1. A coated tool, comprising:
a base member comprising a first surface; and
a coating layer located at least on the first surface of the base member,
wherein
the coating layer comprises:
 a first layer located on the first surface and comprising a titanium compound, and
 a second layer contactedly located on the first layer and comprising aluminum oxide;
the coating layer comprises a plurality of voids located side by side in the first layer in a direction along a boundary between the first layer and the second layer, and an average value of widths of the voids in a direction along the boundary is smaller than an average value of distances between the voids adjacent to each other in a cross section orthogonal to the first surface, and an average value of widths of the voids in a direction parallel to the first surface is greater than an average value of heights of the voids in a direction orthogonal to the first surface in the cross section orthogonal to the first surface;
the second layer comprises, in its thickness direction,
 a lower layer part located at a side of the base member and having a thickness of 0.1 to 2.0 μm, and
 an upper layer part located at a side of the surface which is opposite to the side of the base member and having a thickness of 1.0 to 5.0 μm; and
an angle formed by a normal line of (001) surface of constituent particles with respect to a cross section of the second layer is an orientation difference, the lower layer part of the second layer comprises a ratio of the particles whose orientation difference is 10° or more of 50% or more, and the upper layer part of the second layer comprises a ratio of the particles whose orientation difference is 10° or less of 80% or more.

2. The coated tool according to claim 1, wherein the first layer further comprises titanium carbonitride, and the second layer further comprises α-alumina.

3. The coated tool according to claim 1, wherein an average value of distances from the voids to the boundary is greater than an average value of heights of the voids in a direction orthogonal to the first surface in the cross section orthogonal to the first surface.

4. The coated tool according to claim 1, wherein an average value of distances from the voids to the boundary is greater than an average value of distances between the voids adjacent to each other in the cross section orthogonal to the first surface.

5. A cutting tool, comprising:
a holder comprising a bar shape which extends from a first end to a second end and comprises a pocket located at a side of the first end; and
the coated tool according to claim 1, which is located at the pocket.

6. The coated tool according to claim 3, wherein, in each void of the plurality of voids, a distance from the void to the boundary is greater than a height of the void in a direction orthogonal to the first surface in the cross section orthogonal to the first surface.

7. The coated tool according to claim 1, wherein the first layer comprises a plurality of regions, each having a different composition, with the plurality of regions laminated one on another,
the plurality of regions comprises:
a first region,
a second region located on the first region, and
an intermediate region located between the first region and the second region; and
the plurality of voids are located in the intermediate region.

8. The coated tool according to claim 7, wherein the first region is a moderate temperature TiCN, and the second region is a high temperature TiCN.

9. The coated tool according to claim 1, wherein in the cross section orthogonal to the first surface, the average value of widths of the voids in a direction parallel to the first surface is w1, and the average value of heights of the voids in a direction orthogonal to the first surface is h1, and
a ratio w1/h1 is greater than 1.2.

* * * * *